United States Patent
Yablonskiy et al.

(10) Patent No.: US 7,078,897 B2
(45) Date of Patent: Jul. 18, 2006

(54) MAGNETIC RESONANCE METHOD AND SYSTEM FOR QUANTIFICATION OF ANISOTROPIC DIFFUSION

(75) Inventors: Dmitriy A. Yablonskiy, St. Louis, MO (US); Alexander L. Sukstanskii, St. Louis, MO (US); Mark S. Conradi, St. Louis, MO (US)

(73) Assignee: Washington University, St. Louis, MO (US)

(*) Notice: Subject to any disclaimer, the term of this patent is extended or adjusted under 35 U.S.C. 154(b) by 0 days.

(21) Appl. No.: 10/345,010

(22) Filed: Jan. 15, 2003

(65) Prior Publication Data
US 2003/0160612 A1    Aug. 28, 2003

Related U.S. Application Data

(60) Provisional application No. 60/349,170, filed on Jan. 16, 2002.

(51) Int. Cl.
*G01V 3/00*    (2006.01)

(52) U.S. Cl. .................. 324/307; 324/309; 324/306

(58) Field of Classification Search ............. 324/307, 324/309, 306
See application file for complete search history.

(56) References Cited

U.S. PATENT DOCUMENTS

| | | | |
|---|---|---|---|
| 5,539,310 A | 7/1996 | Basser et al. | |
| 5,671,741 A * | 9/1997 | Lang et al. | 600/415 |
| 5,786,692 A * | 7/1998 | Maier et al. | 324/307 |
| 5,969,524 A | 10/1999 | Pierpaoli et al. | |
| 6,265,872 B1 | 7/2001 | Heid | |
| 6,288,540 B1 | 9/2001 | Chen et al. | |
| 6,463,315 B1 | 10/2002 | Klingberg et al. | |
| 6,487,435 B1 * | 11/2002 | Mistretta et al. | 600/420 |
| 6,498,946 B1 * | 12/2002 | Foo et al. | 600/410 |
| 6,642,716 B1 * | 11/2003 | Hoogenraad et al. | 324/309 |

(Continued)

FOREIGN PATENT DOCUMENTS

WO    WO9504940 A    2/1995

(Continued)

OTHER PUBLICATIONS

Parker, G. J. et al., Nonlinear Smoothing For Reduction of Systematic and Random Errors In Diffusion Tensor Imaging; Journal of Magnetic Resonance Imaging; vol. 11; Jun. 2000; pp. 702-710.

(Continued)

*Primary Examiner*—G. Bradley Bennett
*Assistant Examiner*—Tania Courson
(74) *Attorney, Agent, or Firm*—Cooper & Dunham LLP

(57) ABSTRACT

An MR method and system of determining elements of the apparent diffusion coefficient tensor in a material with plurality of anisotropic structural units that can be too small to be resolved by direct imaging. MR data is acquired with MR system including pulse sequences, the sequences including imaging or spectroscopy pulse sequences with a series of embedded diffusion-sensitizing gradient waveforms with different gradient strength applied to the material. A nonlinear function of a b-value corresponding to the pulse sequence is defined and the acquired MR data is processed according to defined nonlinear function. Images/maps of the components of the tensor of apparent diffusion coefficients, corresponding to anisotropic structural units, based on the processed MR data, are created. A method of evaluating of the geometrical parameters of lung airways is also described.

31 Claims, 8 Drawing Sheets
(1 of 8 Drawing Sheet(s) Filed in Color)

U.S. PATENT DOCUMENTS 6,724,190 B1 * 4/2004 van Muiswinkel et al. . 324/307
6,751,495 B1 * 6/2004 Maier et al. ................. 600/410

FOREIGN PATENT DOCUMENTS

WO WO0138895 A 5/2001

OTHER PUBLICATIONS

Weickert, J. et al. "Fast Parallel Algorithms for a Broad Class of Nonlinear Variational Diffusion Approaches"; Real-Time Imaging; vol. 7; 2001; pp. 31-45.

Basser, et al., "Diffusion-tensor MRI: Theory, Experimental Design and Data Analysis—A Technical Review," NMR in Biomedicine, Jan. 9, 2002; vol. 15, pp. 456-467.

Bihan et al., "From the Diffusion Coefficient to the Diffusion Tensor," NMR in Biomedicine, 2002, vol. 15, pp. 431-434.

Cohen, et al., "High b-value q-space Analyzed Diffusion-Weighted MRS and MRI in Neuronal Tissues-A Technical Review," Feb. 10, 2002, vol. 15, pp. 516-542.

* cited by examiner

MAGNETIC RESONANCE METHOD AND SYSTEM FOR QUANTIFICATION OF ANISOTROPIC DIFFUSION

TECHNICAL FIELD

The present invention relates to the field of Magnetic Resonance Imaging (MRI) and Magnetic Resonance Spectroscopy (MRS). In particular, this invention relates to a system and method for measuring anisotropic molecular diffusion in biological systems and porous materials.

BACKGROUND OF THE INVENTION

Magnetic resonance (MR) is known to allow quantitative measurements of molecular diffusion in different materials (e.g., diffusion of water molecules in biological tissues, diffusion of gas in the lung). Such materials are frequently composed of structural units (e.g., structural units such as cells in biological tissues, airways in lungs, pores in rocks). Boundaries of these units serve as restrictive barriers for diffusing molecules. In case of structurally (geometrically) anisotropic units, molecular diffusion is also anisotropic and can be described by a tensor of diffusion coefficients. If structural units are of sufficient size to be resolved by direct imaging, the tensor of diffusion coefficients can be determined for each structural unit by means of MR imaging with multiply-oriented diffusion-sensitizing gradients.

There is a need for a method and system which allows extracting information on diffusion tensor components in cases where the anisotropic structural units are too small to be resolved by direct imaging and a multitude of differently oriented structural anisotropic units is present in a single imaging voxel. In cases when orientation of these units is random, there is also a need for a method and system in which only diffusion-sensitizing magnetic field gradients oriented in one direction are needed for data acquisition and analysis to extract information on diffusion tensor components.

The invention described below addresses one or more of these and other disadvantages and needs.

SUMMARY OF THE INVENTION

The present invention provides a method of measuring diffusion tensor components in a material comprising anisotropic structural units. This invention is a combination of a MR pulse sequence (multi-b value sequence) to acquire MR data (images or spectra) and a mathematical algorithm for data analysis. It allows measurement of the diffusion tensor components in an anisotropic material in situations in which the imaging unit (voxel or pixel) contains a multitude of arbitrarily oriented anisotropic structural units and the size of each anisotropic structural unit can be too small to be resolved by direct imaging.

An example is a determination of anisotropic diffusion of hyperpolarized gas in small airways of lungs of humans and animals. A MR pulse sequence consists of an imaging or spectroscopy pulse sequence with a series of embedded diffusion-sensitizing gradient waveforms with different gradient strength. Data acquisition takes place after each gradient waveform. A series of data for each imaging unit (pixel or voxel) is analyzed according to the derived theoretical expression, which depends on the diffusion tensor components. Fitting data to this expression allows determination of diffusion tensor components for structural units.

In one form, the invention comprises a method of acquiring MR images of a plurality of anisotropic structural units (that can be too small to be resolved by direct imaging) using an MRI system. The method comprises the steps of:
generating MR pulse sequences via the MRI system to generate MR data corresponding to the structural units, the sequences including imaging or spectroscopy pulse sequences with a series of embedded diffusion-sensitizing gradient waveforms of varying gradient strength;
acquiring the MR data after each gradient waveform;
defining a nonlinear function of a b-value for the pulse sequence;
fitting MR data for each imaging unit (pixel or voxel) to the nonlinear function to determine elements of the apparent diffusion coefficient tensor of structural units for each of the fitted imaging units; and
creating images based on the determined elements of the apparent diffusion coefficient tensor of structural units in the imaging units.

In another form, the invention is an MRI apparatus for acquiring MR images of a material. A magnetic resonance imaging system has a magnetic assembly including a magnet to impress a polarizing magnetic field on the material, a plurality of gradient coils positioned in or around the magnet to impress a logical inhomogeneous magnetic field on the material, a RF transceiver system having an RF coil assembly, and an RF switch for controlling the RF transceiver system to transmit and receive RF signals to and from the material to acquire MR signals representative of the material. A processor acquires multiple sets of MR data from the RF transceiver system, determines a signal intensity for each imaging unit in the MR data, fits the determined signal intensity for each imaging unit in the MR data to a nonlinear function, determines elements of the apparent diffusion coefficient tensor for the fitted MR data, and reconstructs MR images based on the determined elements of the apparent diffusion coefficient tensor. A display displays the reconstructed images as the acquired and processed MR images of the material.

In another form, the invention is a system for acquiring MR images of a plurality of anisotropic structural units (that can be too small to be resolved by direct imaging) using a MRI apparatus. The MRI apparatus acquires MR data corresponding to the structural elements. The sequences from the MRI pulse sequence generator include imaging or spectroscopy pulse sequences with a series of embedded diffusion-sensitizing gradient waveforms of varying gradient strength. A memory stores the MR data acquired after each gradient waveform. A processor fits each imaging unit (pixel or voxel) of the acquired MR data to a nonlinear function to determine elements of the apparent diffusion coefficient tensor for structural units. A display displays images based on the determined elements of the apparent diffusion coefficient tensor for structural units in the imaging unit (pixel or voxel).

In another form, the invention is a MRI method for acquiring MR images of a material using a magnetic resonance imaging system. The system has a magnetic assembly including a magnet to impress a polarizing magnetic field on the material, a plurality of gradient coils positioned about a bore of a magnet to impress a logical inhomogeneous magnetic field on the material, a RF transceiver system having an RF coil assembly, and an RF switch responsive to a pulse module for controlling the RF transceiver system to transmit and receive RF signals to and from the material to acquire MR signals representative of the material. The MRI method comprises the steps of:

acquiring multiple sets of MR data from the RF transceiver system;

determining a signal intensity for each imaging unit from MR data;

fitting the determined signal intensity for each imaging unit from MR data to a nonlinear function;

determining elements of the apparent diffusion coefficient tensor for the fitted MR data; and reconstructing MR images based on the determined elements of the apparent diffusion coefficient tensor; and displaying the reconstructed images of the material.

Alternatively, the invention may comprise various other methods and systems.

Other features will be in part apparent and in part pointed out hereinafter.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Corresponding reference characters indicate corresponding parts throughout the drawings.

DETAILED DESCRIPTION OF THE INVENTION

Figure 1:
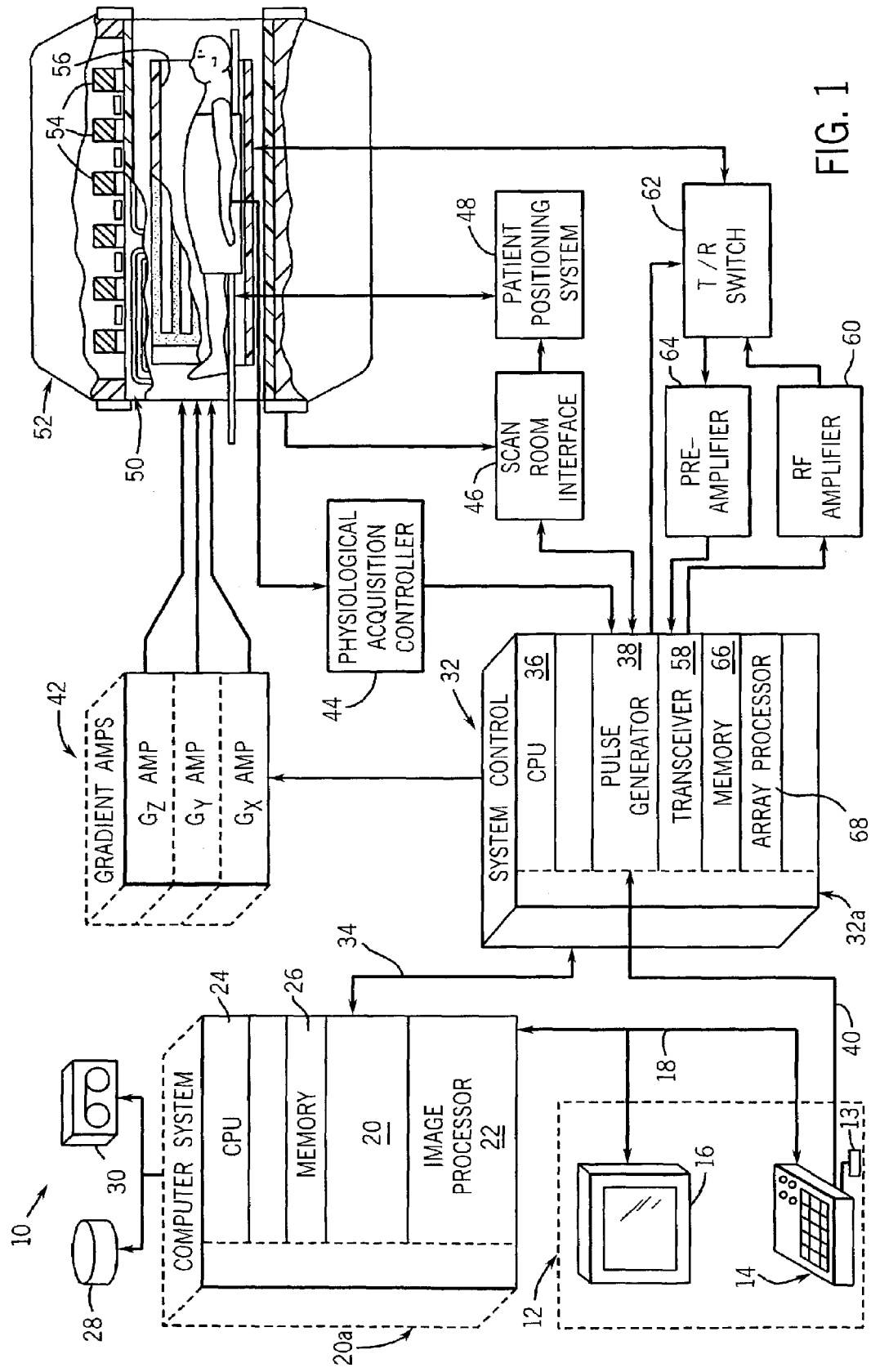
FIG. 1 is a schematic block diagram of an NMR imaging system for use with the present invention.

It is known that atoms or molecules of a gas diffuse; that is, the atoms perform a Brownian-motion random walk. In time interval $\Delta$, the molecules will move a rms (root mean square) distance $\Delta X_{rms}=(2D\Delta)^{1/2}$ along any axis (here X). The diffusion coefficient D is in units of cm$^2$/sec and in free space (no walls or restrictions) is termed $D_0$. The free diffusion $D_0$ is proportional to the rms (thermal) velocity and to the mean free path between collisions, which varies inversely with pressure or density. In the presence of barriers, the diffusive motion is restricted. Thus, any measurement of diffusion will find a smaller rms displacement åX$_{rms}$; in turn, the apparent diffusion coefficient (ADC), $$ADC \equiv (\Delta X_{rms})^2 / 2\Delta, \qquad [1]$$

will be less than $D_0$. The use of the term apparent diffusion coefficient is simply to remind that the true gas diffusivity $D_0$ is unchanged.

The rms displacement and, consequently, ADC strongly depend on the geometry of the volume where atoms diffuse. In non-isotropic systems the rms displacement in different direction is different, e.g., åX$_{rms}$≠åY$_{rms}$; hence, ADC characterizing particle diffusion in the X direction (say $D_x$) does not equal that in the Y direction ($D_y$), $D_x \neq D_y$. In the general case, a diffusivity tensor, $\hat{D}=\{D_{\alpha\beta}\}$, can be introduced by the relationship $$(\Delta r_\alpha \cdot \Delta r_\beta) = 2D_{\alpha\beta}\Delta \qquad [2]$$

where $\Delta r_\alpha$ is a displacement along the $r_\alpha$ coordinate ($r_\alpha$=x, y, z) and < ... > means random walk averaging. The tensor $D_{\alpha\beta}$ is symmetric and therefore can be diagonalized; hence, any system can be characterized by three ADC principal values, e.g., $D_x$, $D_y$, $D_z$. In an isotropic case (free space, sphere, cube) all the coefficients are equal, $D_x=D_y=D_z$. In the uniaxial case (e.g., straight cylinder, ellipsoid of revolution, etc.), diffusion is characterized by two different coefficients, $D_x=D_y\neq D_z$.

The simplest MR measurement of diffusion is the Stejskal-Tanner pulsed field gradient (PFG) experiment [see E. O. Stejskal and J. E. Tanner, "Spin Diffusion Measurements: Spin Echoes in the Presence of a Time-Dependent Field Gradient," *J. Chem.Phys.*, vol. 42, pp. 288–292, 1965] in which a free-induction decay (FID) of MR signal is interrupted by two opposite gradient pulses (the so-called diffusion sensitizing gradients). The PFG experiment, in principle, allows the diffusion to be measured over specific time intervals $\Delta$ (and hence over length scales $(2D\Delta)^{1/2}$). For narrow pulses ( $\delta<<\Delta$) the PFG experiment allows direct measurement of ADC, hence åX$_{rms}$, because the NMR signal decays in the presence of the diffusion sensitizing gradients as $$S = S_0 \exp(-b \cdot ADC) \qquad [3]$$

In the above equation, $S_0$ is the NMR signal intensity in the absence of diffusion-sensitizing gradients, ADC is defined by Eq. [1], and the so-called b-value is determined by the time-dependent field gradient wave-form G(t):

$$b = \gamma^2 \int_0^t dt_1 \left[ \int_0^{t_1} dt_2 G(t_2) \right]^2, \quad [4]$$

(R. F. Karlicek and I. J. Lowe, J. Magn. Res., 37, pp.75–91, 1980, where γ is the gyromagnetic ratio.

For this purpose, both gradient-echo (GE) and spin-echo (SE) pulse waveform can be used for experiments.

An arbitrary material can be represented as a set of elementary structural units. In high-resolution MRI, when a voxel contains only one such a unit, ADC characteristic to the unit can be obtained directly by measuring the decay of signal [3] from each separate voxel. Applying the field gradient along one of the principal axes, a corresponding component of the diffusivity tensor can be found. However, if the field gradient is applied in an arbitrary direction, ADC is a linear combination of $D_x$, $D_y$, and $D_x$:

$$ADC = D_z \cos^2\theta + \sin^2\theta(D_x \cos^2\phi + D_y \sin^2\phi) \quad [5]$$

where θ and φ are polar and azimuthal angles determining the gradient field orientation with respect to the principal axes of the elementary unit under consideration.

It is important to underline that ADC obtained by high-resolution MRI (with a voxel containing only one unit) can be highly anisotropic: for example, in the lung airways oriented along the field gradient, G, ADC is much higher than that in the airways perpendicular to G.

In the case of low-resolution MRI, voxels contain many structural units with different orientation and other geometrical parameters (size, shape, etc.) defining the structural units. Each unit is described by the set of parameters $D_x$, $D_y$, $D_z$ depending on the geometrical parameters of the unit (briefly called λ). To obtain ADC in this situation, the individual signals produced by all units should be added. The signal produced by any given structural unit can be written in the form [5], where the angles θ and φ describe the orientation of the external field in the local coordinate system connected to the unit's principal axes. The resultant signal is an integral over all possible angles θ and φ and geometrical parameters of the units:

$$S = S_0 F(b), \quad [6]$$

where $$F(b) = \int d\lambda p(\lambda) \int_0^\pi \sin\theta d\theta \int_0^{2\pi} d\varphi P_\lambda(\theta, \varphi) \exp \quad [7]$$
$$\{-b[D_z(\lambda)\cos^2\theta + \sin^2\theta(D_x(\lambda)\cos^2\varphi + D_y(\lambda)\sin^2\varphi)]\}$$

where $P_\lambda(\theta, \phi)$ is a distribution function of the unit orientation for a given subset of units characterized by the same parameter λ, and p(λ) is a distribution function of the geometrical parameters.

This b-dependence of the MR signal forms part of one preferred embodiment invention, namely, measuring the MR signals at different b-values and different orientation of the field gradient, G, and fitting experimental data to the analytical expression [7], the integrand in Eq. [7] can be reconstructed, i.e. the distribution functions $P_\lambda(\theta, \phi)$ and p(λ) can be obtained, and corresponding values of $D_{x,y,z}(\lambda)$ can be obtained. Making use of some physical models for diffusion processes in the system under consideration, important information concerning geometrical parameters of the units, where a gas diffuses, can be obtained. For example, on the basis of the experiments on $^3$He diffusion in the lungs, a mean airway radius, which turned out to be in a good agreement with known physiological data, can be calculated (Yablonskiy, D. A., et al. (2002). "Quantitative in vivo assessment of lung microstructure at the alveolar level with hyperpolarized 3He diffusion MRI." *Proc Natl Acad Sci USA* 99(5): 3111–6). In the lungs of patients with severe emphysema this radius is found to be substantially larger than in normal human lungs, as expected.

One advantage of the present invention is that no high-resolution MRI is required for getting elements of the diffusion tensor in structural units smaller than MRI resolution. Multi-b-value measurements provide sufficient information for this purpose.

In the case when the distribution function for the orientation of the units is homogeneous: $P_\lambda(\theta, \phi) = 1/(4\pi)$, the signal [7] does not depend on the orientation of the diffusion-sensitizing field gradient, G, and ADC is isotropic (opposite to the case of anisotropic ADC of each particular unit [5]). In this case, experiments can be fulfilled with any fixed orientation of the field gradient. However, in more general case, when the distribution function for unit orientations is not homogeneous, measurements with different orientations of G are required. Besides, additional information can be obtained by varying b-value by changing waveform parameters.

In the case when the distribution function for units orientation is homogeneous and units are similar, i.e. all the units have the same geometrical parameters λ and, consequently, the same values of $D_x$, $D_y$, $D_z$, we introduce mean diffusivity $$D_{AV} = \frac{1}{3}(D_x + D_y + D_z), \quad [8]$$

in-plane anisotropy diffusivity $$d_{AN} = \frac{1}{2}(D_x - D_y), \quad [9]$$

out-of-plane anisotropy diffusivity $$D_{AN} = D_z - \frac{1}{2}(D_x + D_y): \quad [10]$$

and present the signal, S, by the Eq. [6] with the F-function:

$$F(b) = \exp(-bD_{AV})\exp\left(\frac{bD_{AN}}{3}\right)\frac{1}{4\sqrt{\pi}} \quad [11]$$
$$\int_0^{2\pi} d\varphi \exp(-bD_{AN}\cos^2\varphi) \frac{\Phi[(bD_{AN} - bd_{AN}\cos 2\varphi)^{1/2}]}{(bD_{AN} - bd_{AN}\cos 2\varphi)^{1/2}}$$

where Φ(x) is the error function.

For units with uniaxial symmetry, when $D_x = D_y \neq D_z$, $d_{AN} = 0$, the integral in Eq.[11] can be calculated in an explicit form yielding for F-function:

$$F(b) = \exp(-bD_{AV}) \frac{\sqrt{\pi}}{2} \exp\left(\frac{bD_{AN}}{3}\right) \cdot \frac{\Phi(\sqrt{bD_{AN}})}{\sqrt{bD_{AN}}}, \quad [12]$$

[12]

Hence, in the case where the distribution function for units' orientation is homogeneous the signal turns out to be a function of 4 parameters ($S_0$, $D_{AV}$, $D_{AN}$, $d_{AN}$) that can be determined by fitting experimentally obtained signals for several values of b to the functions in Eq.[11] (or Eq.[12] for $d_{AN}=0$). This procedure can be readily fulfilled by means of some standard routines.

One Exemplary Practical Implementation of the Invention

This invention may be implemented on any MRI scanner that is equipped with:

- Magnet that generates homogeneous magnetic field B0 in a certain space where imaged material is positioned. The field B0 polarizes spins of the protons and other nuclei that are present in the material and creates longitudinal nuclear magnetization;
- Gradient coils and generator capable of creating fast switching field gradients (G)—additional magnetic field along the direction of B0 with the amplitude linearly changing in space;
- RF coils and RF generator capable of transmitting electromagnetic energy with frequencies in the range of magnetic resonance frequencies corresponding to applied magnetic field;
- RF coils and RF receiver capable of receiving electromagnetic energy with frequencies in the range of magnetic resonance frequencies corresponding to applied magnetic field;
- A device capable of digitizing analog signal (analog-to-digital converter);
- A computer system capable of governing the operation of the above-described hardware according to the prior programmed pulse sequence;
- A computer system capable of storing and processing digitized magnetic resonance signals according to prior developed algorithms to produce images.

Those skilled in the art will appreciate that the above-described components are standard equipment in the commercially available MRI scanners.

One Preferred Embodiment—Quantification of Anisotropic Diffusion with Two-dimensional (2D) Multi-Slice Diffusion Gradient Echo Imaging.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage device 28 and a tape drive 30 for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38, which connects to the operator console 12 through a link 40. It is through link 40 that the system control 32 receives commands from the operator, which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46, which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in an assembly generally designated 50 to produce the magnetic field gradients used for spatially encoding the acquired MR signals. The gradient coil assembly 50 forms part of a magnet assembly 52, which includes a polarizing magnet 54 and a whole-body RF coil 56. A transceiver module 58 in the system control 32 produces pulses, which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either transmit or receive mode.

The MR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention can be implemented in such an MRI scanner. In general, the magnet generates homogeneous magnetic field $B_0$ in a space where the imaged material is positioned. The field $B_0$ polarizes spins of the protons and other nuclei that are present in the subject's body and creates longitudinal nuclear magnetization. The gradient coils and the generator create fast switching field gradients (G), which are additional magnetic fields along the direction of $B_0$ with the amplitude changing linearly in space. The RF coils and RF generator transmit electromagnetic energy with frequencies in the range of the magnetic resonance frequencies corresponding to the applied magnetic field. The RF coils and RF receiver receive electromagnetic energy with frequencies in the range of the magnetic resonance frequencies corresponding to the applied magnetic field. An analog-to-digital converter digitizes analog signals and the computer system governs the operation of the above-described hardware according to a given pulse sequence. The computer system then stores and processes digitized magnetic resonance signals according to prior developed algorithms to produce MR images. These components are standard equipment in commercially available MRI scanners.

After material is positioned in the MRI scanner, a series of RF and gradient pulses (pulse sequence 80) designed according to FIG. 2 described below is produced by the MRI scanner and RF receiving coils and amplifiers collect magnetic resonance signal. The signal is then digitized and stored in the computer memory and processed according to the algorithms described below to produce diffusion tensor components maps of the material. In this embodiment images are acquired as a series of diffusion weighted two-dimensional sections (also called slices) of the material.

Figure 2:
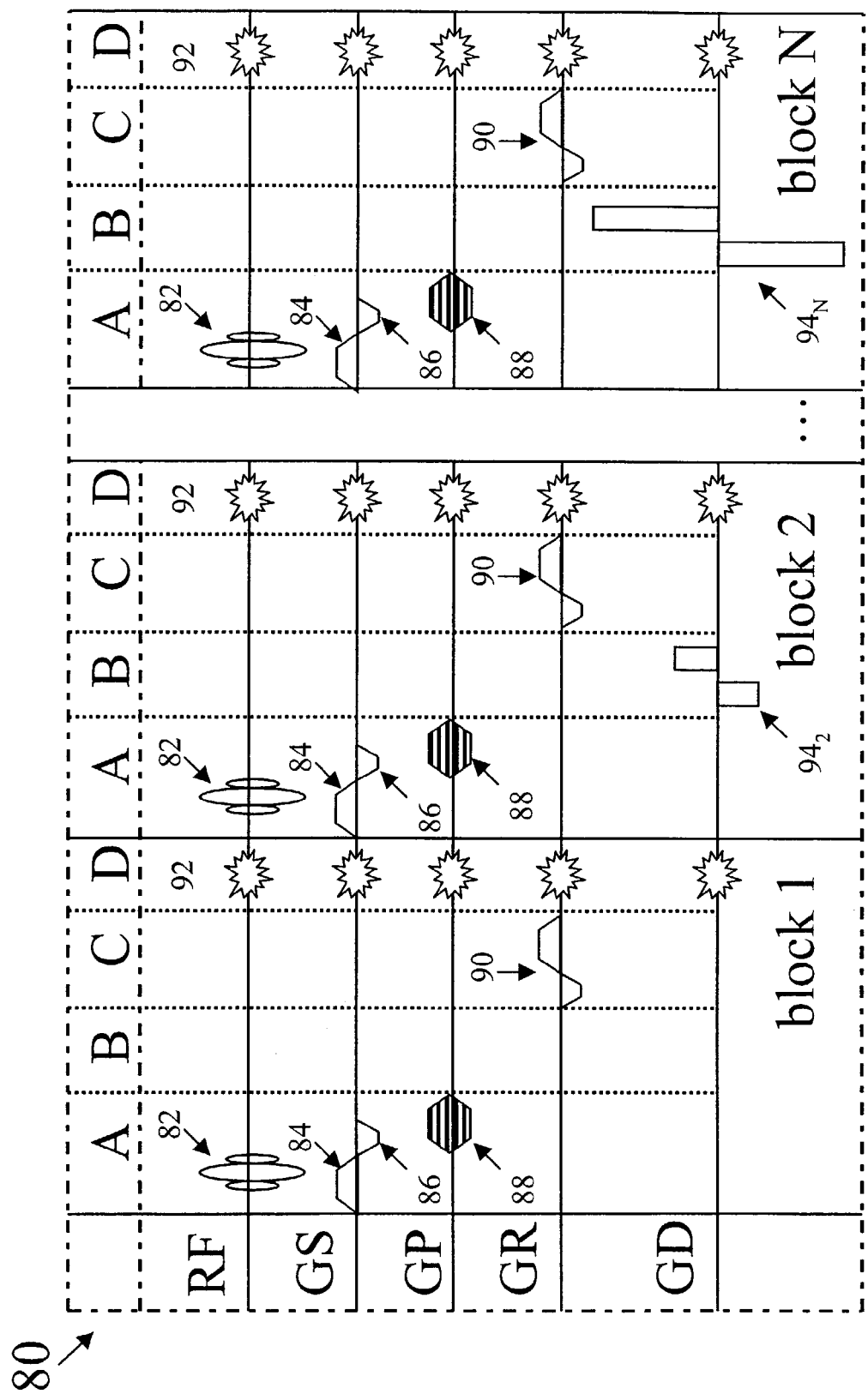
FIG. 2 is a timing diagram depicting a pulse sequence for two-dimensional multi-slice gradient echo diffusion imaging in accordance with the present invention.

FIG. 2 represents a schematic structure of the pulse sequence 80 designed to (a) encode 2D information on the spatial distribution of the material's diffusion tensor components; (b) to collect necessary magnetic resonance signal that may be reconstructed to produce 2D maps of diffusion tensor components of the material. This pulse sequence consists of N blocks (block 1, block 2, . . . , block N) each consisting of four sub-blocks—A, B, C, and E. Each block is designed to create a 2D MR image with certain diffusion weighting. All N blocks have the same small-angle RF pulse 82, and the same slice selection 84 and 86, phase encode 88, and read-out 90 gradients. All sequences except the first one include diffusion-sensitizing gradients 94 with increasing amplitudes, $G_m$, and consisting of one bipolar pulse pair as in FIG. 3. Data are collected in an interleaved manner by collecting the same line in k-space for all N images prior to stepping to the next line, ensuring reduced sensitivity to motion artifacts. Central reordering can be used to reduce the possible influence of signal decay during acquisition.

Block A, FIG. 2, is designed to select a section in the material that needs to be imaged and create a one-dimensional spatial encoding in this section.

Simultaneously applied RF pulse 82 with flip angle α and a gradient pulse 84—GS (GS stands for the slice-selection gradient pulse) rotate tissue nuclear longitudinal magnetization in a given section from the longitudinal direction by the angle α and create transverse magnetization that can be detected by RF coils as a magnetic resonance signal. The second lobe of the slice-selective gradient pulse waveform 86 with a certain amplitude and duration is applied in the opposite direction to the pulse 84 to enhance magnetic resonance signal by rephasing transverse magnetization created and dephased during the slice-selection procedure. Those skilled in the art appreciate that this is a commonly used procedure for slice selection.

Gradient pulse 88, GP, with a certain amplitude and duration is applied in the phase-encoding direction (one of the two orthogonal directions in the selected slice) to encode spatial information on the material properties in this direction into the magnetic resonance signal. Those skilled in the art appreciate that this is a commonly used procedure in the 2D Fourier-Transform imaging.

Block B, FIG. 2 is designed to create diffusion weighting in the image intensity. It consists of a pair of diffusion-sensitizing gradient pulses 94 with the same amplitude and opposite direction. For the pulse waveform depicted in FIG. 3, the b-value is:

$$b = (\gamma G_m)^2 \left[ \delta^2 \left( \Delta - \frac{\delta}{3} \right) + \tau \left( \delta^2 - 2\Delta\delta + \Delta\tau - \frac{7}{6}\delta\tau + \frac{8}{15}\tau^2 \right) \right] \quad [13]$$

[see P. J. Basser, J. Mattiello, and D. LeBihan, "MR diffusion tensor spectroscopy and imaging," Biophys J, vol. 66, pp. 259–67, 1994] where $G_m$ is the maximum gradient amplitude, Δ is the diffusion time, δ is the pulse width, and τ represents an up/down ramp time.

The amplitude $G_m$ of the diffusion-sensitizing gradient waveform is equal to zero in block 1 and is step-wise incremented in blocks 2, 3, . . . N, defining b-values $$b_1, b_2 \ldots, b_N \quad [14]$$

according to Eq. [13].

Block C, FIG. 2, is designed to encode spatial information on the materialproperties in the read-out direction. It consists of the bipolar gradient pulse waveform 90, GR, with a certain structure applied in the read-out direction (second of the two orthogonal directions in the selected slice). The first lobe of gradient pulse 90 preliminarily rephases transverse magnetization in order to define position of the gradient echo during the second lobe of pulse 90. Those skilled in the art appreciate that this is a commonly used procedure to define the gradient echo in Fourier-Transform imaging.

Block D, FIG. 2, is designed to destroy residual transverse magnetization. Any of the standard techniques such as gradient spoiling or RF spoiling can be utilized. Those skilled in the art appreciate that these are well known and commonly used procedures. This block can also include a waiting period designed to restore longitudinal magnetization in a given slice if thermal equilibration is used for magnetization recovery. During this period, no RF pulses are applied to a given slice allowing recovery of the longitudinal magnetization due to the T1 relaxation processes.

To collect information necessary to reconstruct images, the whole procedure (blocks 1 through N) should be repeated again $N_p$ times ($N_p$ is the image resolution in the phase-encoding direction). Those skilled in the art appreciate that during each such repetition the phase-encoding gradient should be incremented by a certain calculated amount to achieve full coverage of the image k-space. The result of such procedure is N covered k-spaces corresponding to N gradient echo images, where the n-th gradient echo image has diffusion weighting specified by b-value $b_n$[14]. Two-dimensional Fourier transform of each set of k-space data results in N complex images $$\rho_n(x,y) \cdot \exp(-i\phi_n(x,y)), n=1,2, \ldots, N. \quad [15]$$

Here $\rho_n(x, y)$ and $\phi_n(x, y)$ are image intensity and phase correspondingly, and x and y are image spatial coordinates in the read-out and phase-encoding directions.

It is known to those skilled in the art that the noise in the images can be reduced by repeatedly collecting the same data in k-space and averaging the complex data.

Images of other sections of the material can be obtained by repeating the above procedure with a new section position—the so-called multi-slice sequential imaging. Alternatively, the waiting period in Block D can be used to collect magnetic resonance signal from other slices by subjecting them to the procedures described above. To those skilled in the art this is known as a 2D multi-slice interleaved imaging—a procedure substantially reducing imaging time with increased signal-to-noise ratio.

It is known to those skilled in the art that the phase of the RF pulse in Block A can be alternated in a known way to reduce certain image artifacts.

After N images of each slice are obtained, they are analyzed on a pixel-by-pixel basis to produce maps of diffusion tensor components. To do that, for each pixel (x,y) a data array is formed from the signal magnitude and assigned to the magnetic resonance signal amplitude as a function of $b_n$:

$$S(x, y, b_n) = \varnothing_n(x, y). \quad [16]$$

For each pixel (x,y) the magnitude signal [16] is then fit to Eq. [6] with the F-function from one of equations [11] or [12] depending on the system symmetry and images $D_{AV}(x, y)$, $D_{AN}(x, y)$ and $d_{AN}(x, y)$ are produced. If more complicated models, such as in Eqs. [7] are used, then $D_{AV}(x, y)$, $D_{AN}(x, y)$ and $d_{AN}(x, y)$ images may be produced for each of the compartments in the tissue. This procedure is then repeated for each imaged section.

Another Preferred Embodiment—Quantification of Anisotropic Diffusion with Three-dimensional (3D) Diffusion Gradient Echo Imaging.

Figure 4:
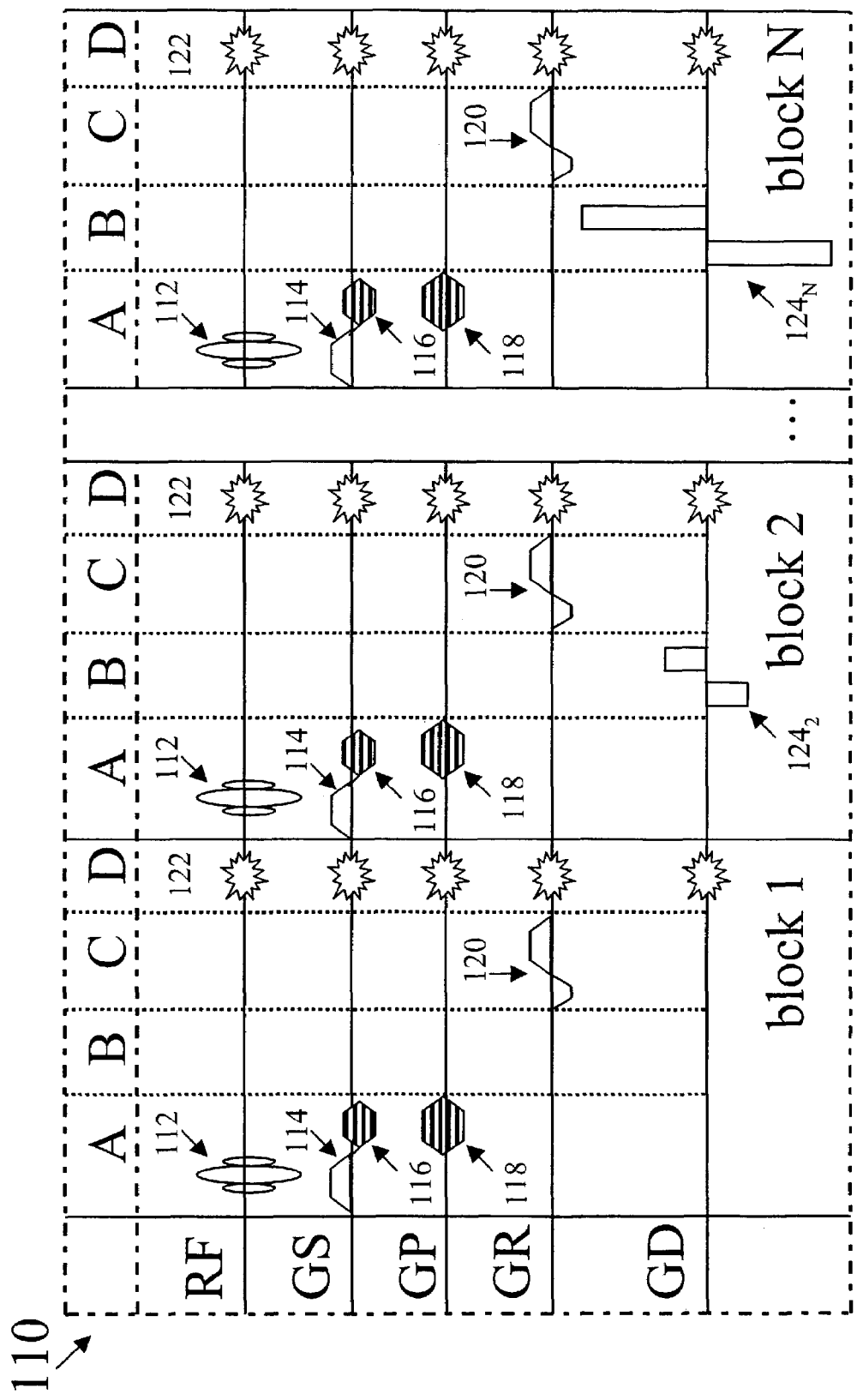
FIG. 4 is a timing diagram depicting a pulse sequence for three-dimensional gradient echo diffusion imaging in accordance with the present invention.

This embodiment is different from the First Embodiment only in how MR signal is encoded in the slice-selection direction. FIG. 4 represents a schematic structure of the pulse sequence 110 designed to (a) encode 3D information on the spatial distribution of the material/substance diffusion tensor components; (b) to collect necessary magnetic resonance signal that may be reconstructed to produce 3D maps of diffusion tensor components of the material.

The difference between pulse sequence 80 in FIG. 2 and pulse sequence 110 in FIG. 4 is in the design of the sub-block A. Hence, only this block will be described.

The sub-block A, FIG. 4, is designed to select a section in the subject/object body that needs to be imaged. It consists of simultaneously applied RF pulse 112 with flip angle α and a gradient pulse Gs 114 (Gs in this case stands for the slab-selective gradient pulse). Such a combination rotates tissue nuclear longitudinal magnetization in a given section from the longitudinal direction by the angle α and creates transverse magnetization that can be detected by RF coils as a magnetic resonance signal. The second lobe of the gradient pulse Gs 116 with a certain amplitude and duration is applied in the direction perpendicular to the plain of the selected slab to encode spatial information on the material properties in this direction into the magnetic resonance signal. Those skilled in the art appreciate that this is a commonly used procedure in the 3D Fourier-Transform imaging.

To collect information necessary to reconstruct images, the pulse sequence 110 should be repeated again Np×Ns times (Np is the image resolution in the phase-encoding direction and Ns is the image resolution in the slab-selection direction). Those skilled in the art appreciate that during each such repetition the 2D (118) and 3D (116) phase-encoding gradients should be incremented by a certain calculated amount to achieve full coverage of the 3D image k-space. Data are collected in an interleaved manner by collecting the same line in k-space for all N images prior to stepping to the next line, ensuring reduced sensitivity to motion artifacts. Central reordering can be used to reduce the possible influence of signal decay during acquisition. Result of such procedure is N covered 3D k-spaces corresponding to N gradient echoes where the n-th gradient echo has diffusion weighting defined by the n-th b-value, $b_n$. Three-dimensional Fourier transform of each of k-spaces results in N complex 3D images $$\rho p_n(x,y,z) \cdot \exp(-i \cdot \phi_n(x,y,z)) \; n=1, 2, \ldots, N \quad [17]$$

Here $\rho_n(x,y,z)$ and $\phi_n(x,y,z)$ are image intensity and phase correspondingly; x, y and z are image spatial coordinates in the read-out, phase-encoding and slab-selection directions.

After N images of each slice are obtained, they are analyzed on a pixel-by-pixel basis to produce maps of diffusion tensor components. To do that, for each pixel (x,y) a data array is formed from the signal magnitude and assigned to the magnetic resonance signal amplitude as a function of $b_n$:

$$S(x, y, b_n) = \varnothing_n(x, y, z). \quad [18]$$

For each pixel (x, y, z) the magnitude signal [18] is then fit to one of equations [11] or [12] depending on the system symmetry and images $D_{AV}(x, y, z)$, $D_{AN}(x, y, z)$ and $d_{AN}(x, y, z)$ are produced. If more complicated models, such as in Eq. [7] are used, then $D_{AV}(x, y, z)$, $D_{AN}(x, y, z)$ and $d_{AN}(x, y, z)$ images may be produced for each of the compartments in the tissue.

Other Preferred Embodiments

Although two embodiments of the invention have been described in detail, those skilled in the art will appreciate that additional modifications are possible. For example, 2D or 3D gradient echo images corresponding to different b-values can be collected by means of a spiral scanning technique instead of the Fourier Transform Imaging technique discussed herein. Data may then be arranged according to Eqs. [16] and [18], and analyzed using the same algorithms as previously discussed to provide maps of the diffusion tensor components.

Figure 5:
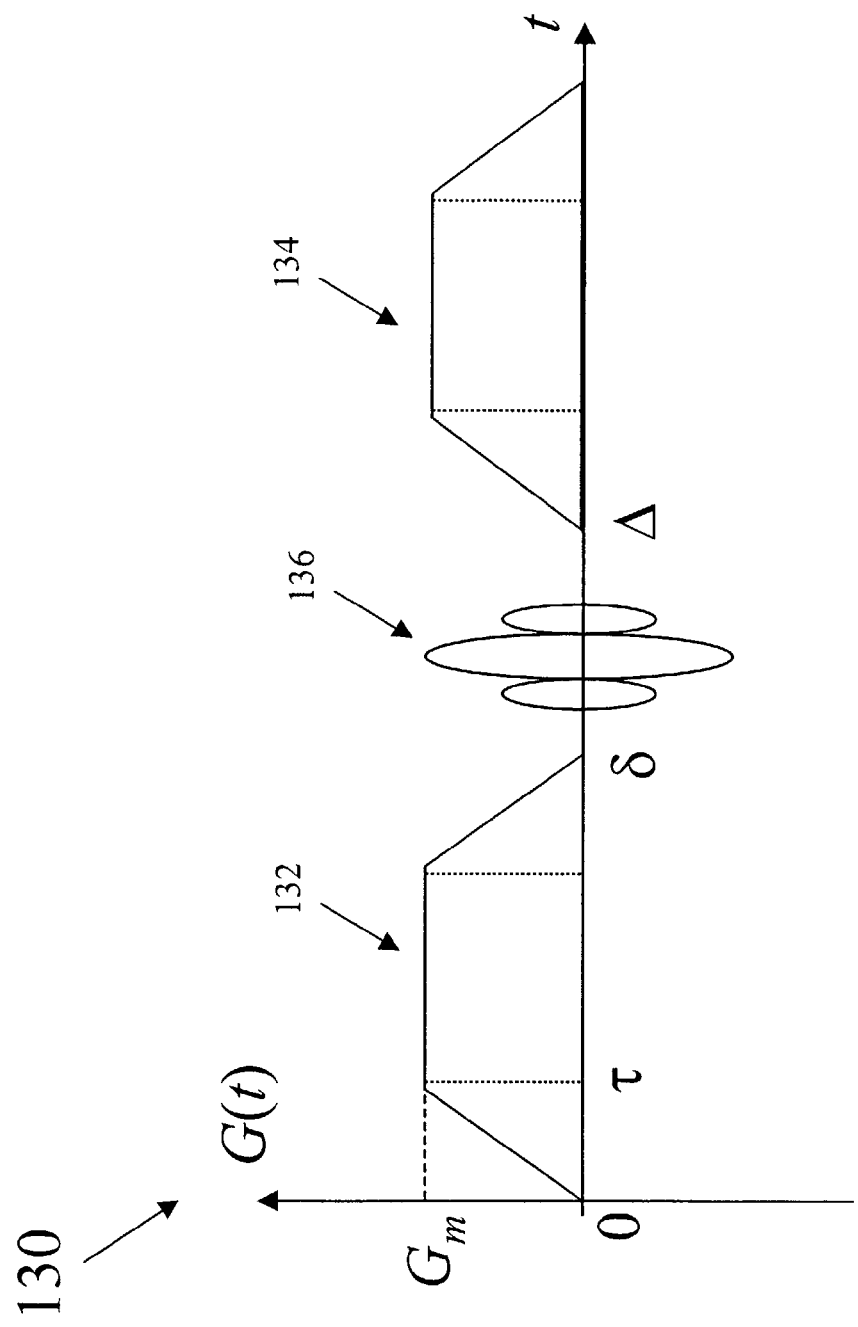
FIG. 5 is a timing diagram depicting a diffusion-sensitizing gradient waveform and refocusing RF pulse used with pulse sequence for two-dimensional multi-slice and three-dimensional spin echo diffusion imaging in accordance with the present invention.

Other possibilities include 2D and 3D spin echo imaging. In this case the sub-block B in FIGS. 2 and 4 should be modified to include refocusing RF pulse 136 as shown in FIG. 5. Data may then be arranged according to Eqs. [16] and [18], and analyzed using the same algorithms as previously discussed to provide maps of the diffusion tensor components.

Yet another possibility includes the method in which spatial encoding is achieved by means of localized volume spectroscopy. In this case, the sub-block A in FIG. 2 is substituted by PRESS [P. A. Bottomley, "Spatial localization in NMR spectroscopy in vivo," *Ann. NY Acad. Sci.*, vol. 508, pp. 333–348, 1987.] or STEAM [J. Frahm, H. Bruhn, M. L. Gyngell, K. D. Merboldt, W. Hanicke, and R Sauter, "Localized high-resolution proton NMR spectroscopy using stimulated echoes: initial applications to human brain in vivo," *Magn Reson Med*, vol. 9, pp. 79–93, 1989] or any other voxel-selection procedures. The sub-block C is eliminated and the so-called free induction decay signal or spin echo signal or stimulated echo signal is collected.

Figure 6:
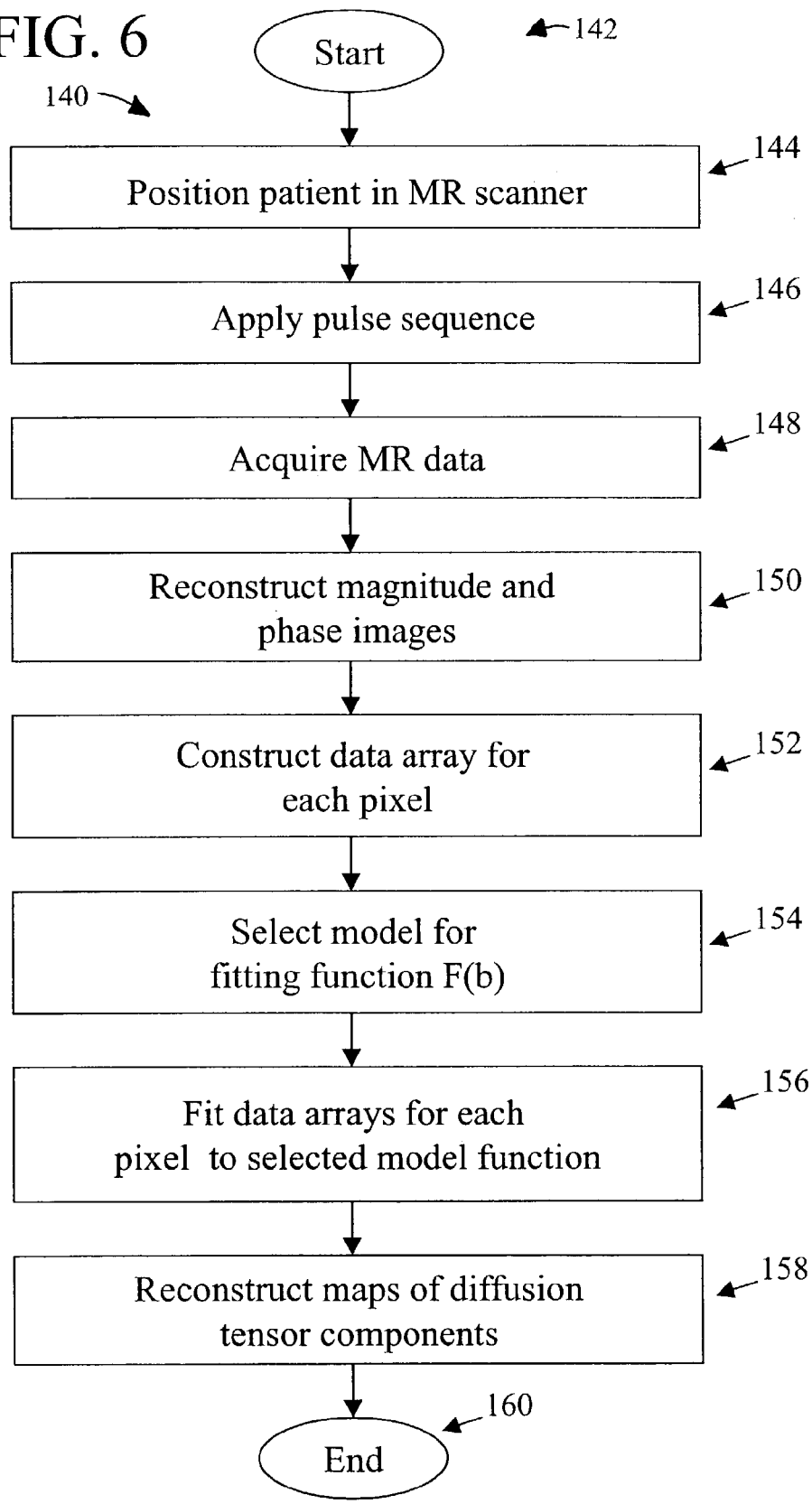
FIG. 6 is a flow chart showing an implementation of the present invention for use with the system of FIG. 1.

Referring now to FIG. 6, a flow chart of the aforementioned algorithms 140 is shown. After initialization 142 and positioning a patient in the scanner 144, the pulse sequences 146 is applied and MR data is acquired at 148. After reconstructing magnitude and phase images 150, the data arrays are constructed for each pixel 152 and the model for fitting function $F(b_n)$ is selected 154. The data arrays are then fit to Eqs. [11] or [12] or [7] depending on the system properties 156 and the system is able to reconstruct images (maps) $D_{AV}(x, y, z)$, $D_{AN}(x, y, z)$ and $d_{AN}(x, y, z)$.

This invention includes:

a. A new theoretical underlying concept which has been developed;

b. The MRI pulse sequence has been designed and implemented (e.g., on a SIEMENS Magnetom VISION scanner); and c. Data collection on a phantom, humans and animals (dogs and pigs) with obtained results which support the theoretical concept of the invention.

Lungs of healthy volunteers and patients with emphysema have been imaged using the above-discussed pulse sequence and hyperpolarized $^3$He gas prepared in the laboratory of Dr. Mark Conradi at the Physics Department, Washington University. Data were analyzed using the above-discussed theoretical expression [12]. It was determined that the diffusion of $^3$He gas in the human lung is highly anisotropic. It was also determined that both longitudinal and transverse diffusion coefficients in the lungs of patients with severe emphysema are substantially larger than in normal human lungs.

The present invention has been described in terms of the preferred and several other embodiments, and it is recognized that equivalents, alternatives, and modifications, aside from those expressly stated, are possible and within the scope of the appending claims.

AN EXAMPLE—USE OF QUANTITATIVE IN VIVO ASSESSMENT OF LUNG MICROSTRUCTURE

The following is an example illustrating the invention in the use of quantitative in vivo assessment of lung microstructure at the alveolar level with hyperpolarized $^3$He diffusion magnetic resonance imaging.

Quantitative localized characterization of emphysema requires knowledge of lung structure at the alveolar level in the intact living lung. This information is not available from traditional imaging modalities and pulmonary function tests. Herein we show that $^3$He diffusion gas MRI can provide such information. We present a theoretical analysis and experimental data demonstrating that $^3$He gas diffusivity in the acinus of human lung is highly anisotropic allowing extraction of the geometrical lung parameters at the alveolar level from $^3$He diffusion MR images. Our results demonstrate substantial differences in the structure of lungs in healthy human subjects and patients with severe emphysema.

The following is an explanation of what specific features of the lung microstructure are probed by gas ADC measurements. In our model of gas diffusion in lung, we consider airways rather than alveoli as the elementary structural units. We approximate the airways as long cylinders—either smooth (trachea, bronchi and bronchioles) or covered with alveolar sleeves (respiratory bronchioles, alveolar ducts and alveolar sacs). Because about 95% of gas in the lung resides in the acini, the acinar airways contribute nearly the entire MR signal. The alveolar walls, as well as the walls of alveolar ducts and other branches of the airway tree, serve as obstacles to the path of diffusing $^3$He atoms and reduce the $^3$He diffusivity. Crucially, these restrictions are substantially different along the airway axis and perpendicular to it, so that diffusion in the lung should be anisotropic.

For the spatial resolutions presently available in $^3$He MRI in humans (millimeters or larger), each volume element (voxel) contains a great many airways with different orientations. Diffusion in the directions parallel and perpendicular to the airway axis for each individual airway can be described by means of longitudinal, $D_L$, and transverse, $D_T$, ADCs. Because each imaging voxel contains hundreds of acinar airways, we can assume that their orientation distribution function is uniform. Therefore after summing over all airway orientations, the signal, S, can be written in the form of Eq. [6] with F-function from Eq. [12], and $$D_{AV} = \frac{1}{3}D_L + \frac{2}{3}D_T, \quad D_{AN} = D_L - D_T \qquad [19]$$

defined through longitudinal and transverse ADCs.

Figure 7:
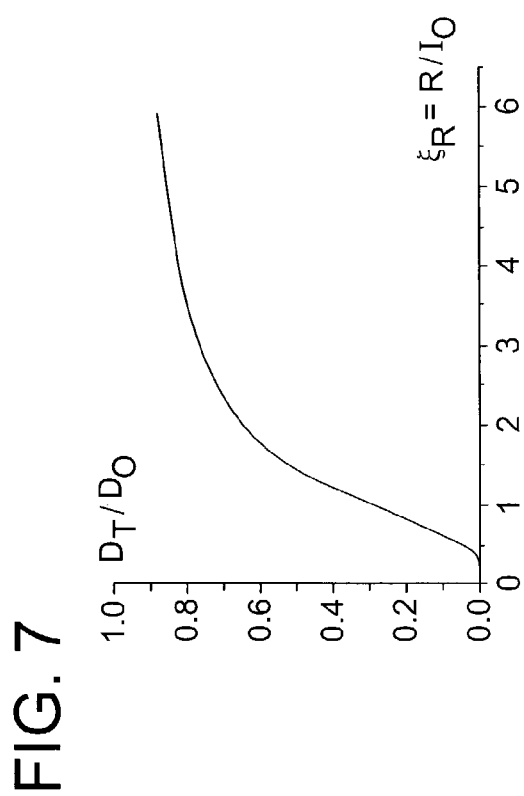
FIG. 7 illustrates the transverse $^3$He diffusivity, $D_T$, as a function of the airway external radius R. $D_0$ is the $^3$He diffusion coefficient in free air, and $l_0 = (2D_0\Delta)^{1/2}$ is the characteristic diffusion length. The gradient waveform parameters $\Delta=\text{ú}=1.8$ msec, $\text{õ}=0.5$ msec are described in FIG. 3.

The relationship between transverse diffusivity and airway radius R can be obtained by utilizing the Gaussian phase distribution approach (C. H. Neuman, J. Chem. Phys., vol. 60, pp. 4508–4511, 1973). The relationship is described in detail in the attached Appendix. The ratio $D_T/D_0$ as a function of tube radius R in terms of $R/l_0$ is plotted in FIG. 7, where $D_0$ is the $^3$He diffusion coefficient in free air and $l_0$ is a characteristic diffusion length, $l_0=(2D_0å)^{1/2}$.

Figure 3:
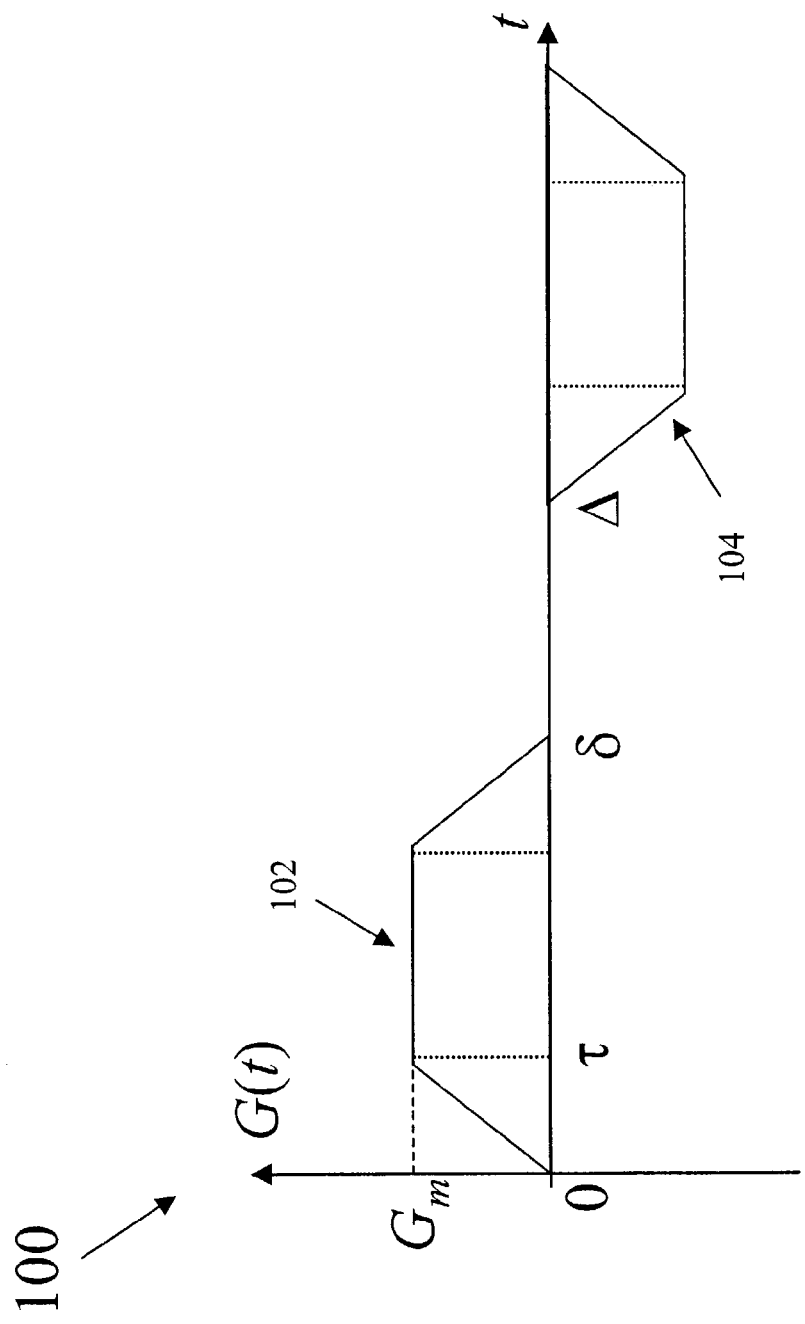
FIG. 3 is a timing diagram depicting a diffusion-sensitizing pulse gradient waveform employed to sensitize the MR signal to $^3$He gas molecular diffusion for two-dimensional multi-slice and three-dimensional gradient echo diffusion imaging in accordance with the present invention. Characteristic parameters of the waveform are the maximum gradient amplitude $G_m$, the diffusion time $\Delta$, the pulse width d, and the ramp time t. Parameter values used in experiments are $\Delta=\text{ú}=1.8$ msec, $\text{õ}=0.5$ msec.

Methods: We use a pulse sequence for $^3$He diffusion lung imaging depicted in FIG. 2 with six 2D gradient echo sequences combined together so that each has the same RF pulse of 7°, gradient echo time TE=7.2 ms and slice selection, phase encode, and read-out gradients. All sequences except the first one include diffusion-sensitizing gradients with increasing amplitudes, $G_m$, consisting of one bipolar pulse pair (FIG. 3). The corresponding b-values are 0, 1.5, 3, 4.5, 6 and 7.5 sec/cm$^2$. The k-space data are collected in an interleaved manner. Four 20-mm slices with in-plane resolution of 7 mm×7 mm (32×64 matrix) were obtained from each subject. All images were acquired with a 1.5 T whole body Siemens Magnetom Vision scanner.

Results: Two normal volunteers and four patients with severe emphysema selected for lung volume reduction surgery were studied. Diffusivity maps were calculated by fitting experimental data to Eq. [6] with F-function from Eq. [12] on a pixel-by-pixel basis using Bayesian probability theory with uninformative prior probabilities. The transverse and longitudinal diffusivities were then obtained from Eq. [19] and the mean radii of acinar airways deduced from transverse diffusivity $D_T$ ( FIG. 7). Results for all subjects are summarized in Table 1.

|  | $D_{AV}$ | $D_L$ | $D_T$ | R |
|---|---|---|---|---|
| Normal 1 | 0.21 | 0.40 | 0.11 | 0.37 |
| Normal 2 | 0.17 | 0.30 | 0.10 | 0.36 |
| Patient 1 | 0.41 | 0.73 | 0.25 | 0.53 |
| Patient 2 | 0.46 | 0.79 | 0.29 | 0.59 |
| Patient 3 | 0.42 | 0.74 | 0.25 | 0.55 |
| Patient 4 | 0.40 | 0.62 | 0.20 | 0.47 |

Table 1. Rows for each subject represent mean data (diffusivities, D, in cm$^2$/sec and airway external radii, R, in mm).

Figure 8:
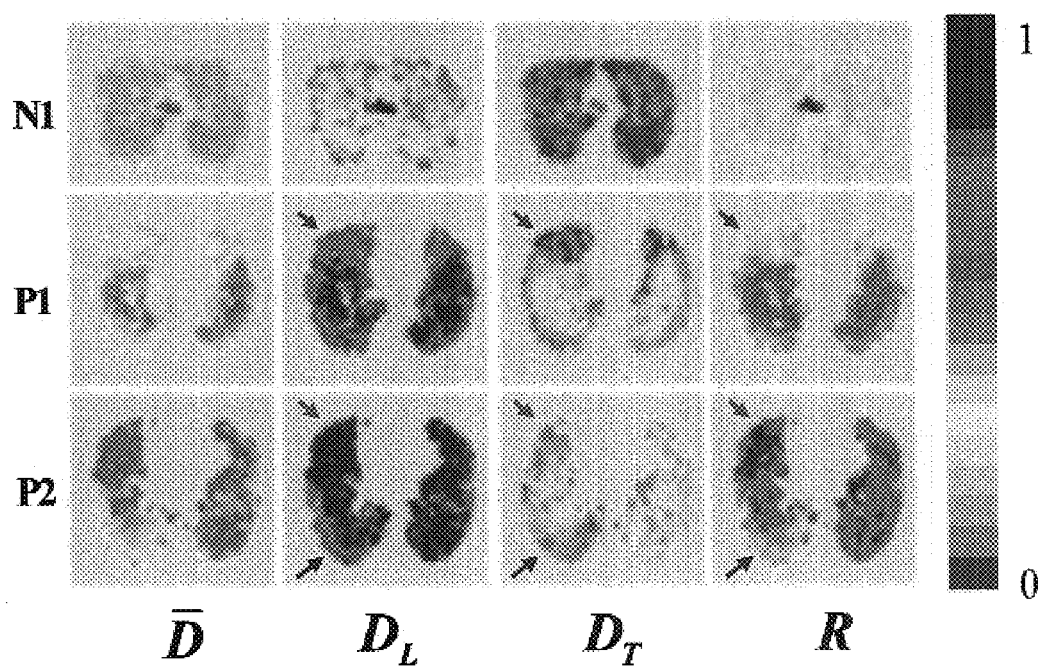
FIG. 8 illustrates representative single-slice maps of diffusivities for a normal subject (N1) and two patients with severe emphysema (P1 and P2). From left to right the columns display the orientation-averaged diffusivity $D_{AV}$, longitudinal value $D_L$, the transverse diffusivity $D_T$, and the mean airway radius R. The color scale on the right represents diffusivity coefficients in cm$^2$/sec and airway radii in mm. Each color corresponds to 0.05 unit. Brown arrows B point to an area of emphysematous lung with minor airway destruction, pink arrows P point to an area of emphysematous lung with moderate airway destruction, and green arrows G point to a lung area with severe emphysema. The small high-diffusivity regions in N1 are the two major bronchi just below their branching from the trachea.

An example of images is shown in FIG. 8. FIG. 8 illustrates representative single-slice maps of diffusivities for a normal subject (N1) and two patients with severe emphysema (P1 and P2). From left to right the columns display the orientation-averaged diffusivity $D_{AV}$, longitudinal value $D_L$, the transverse diffusivity $D_T$, and the mean airway radius R. The color scale on the right represents diffusivity coefficients in $cm^2/sec$ and airway radii in mm. Each color corresponds to 0.05 units. Brown arrows B point to an area of emphysematous lung with minor airway destruction, pink arrows P point to an area of emphysematous lung with moderate airway destruction, and green arrows G point to a lung area with severe emphysema. The small high-diffusivity regions in N1 are the two major bronchi just below their branching from the trachea.

Conclusions: The following can be drawn from our results:

In healthy subjects, transverse diffusivity is strongly restricted with the mean $D_T$ almost eight times smaller than the unrestricted $^3$He diffusivity in air ($D_0$=0.88 $cm^2/sec$). All $D_T$ maps are highly homogeneous.

In healthy subjects, the maps defining the mean external transverse radius of acinar airways, R, are highly homogeneous with R changing between 0.38 mm and 0.36 mm from apices to base for the first subject and from 0.36 mm to 0.35 mm in the second subject. This result is in remarkable agreement with in vitro measurements of mean R=0.35 mm (B. Haefeli-Bleuer and E. R. Weibel, Anat Rec, vol. 220, pp. 401–14., 1988).

In all of the subjects, for both normal and emphysematous lungs, gas diffusivity is anisotropic with the mean transverse diffusivity being usually two to three times smaller than the mean longitudinal diffusivity.

Nearly all transverse diffusivity maps in patients with severe emphysema show increased $D_T$ as compared to normal subjects, but the diffusion is still restricted ($D_T$<$D_0$). This means that the ventilated airways partially retain their integrity in the transverse direction. The increase in the transverse diffusivity can be explained by an increase in the mean airway radius R and by destruction of alveolar walls separating different airways—features characteristic of emphysema.

The longitudinal diffusivity $D_L$ in patients with severe emphysema is also substantially elevated, becoming practically unrestricted in some parts of the lungs. This effect is mainly due to destruction of alveolar sleeves.

When introducing elements of the present invention or the embodiment(s) thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that the several objects of the invention are achieved and other advantageous results attained.

As various changes could be made in the above systems and methods without departing from the scope of the invention, it is intended that all matter contained in the above description and shown in the accompanying drawings shall be interpreted as illustrative and not in a limiting sense.

Appendix

The MR signal produced by a system of precessing spins is the sum of the signals produced by the individual spins at time t after the RF pulse:

$$S(t) = S_0 \cdot s(t), \quad s(t) = \int_{-\infty}^{\infty} d\varphi P(\varphi, t) \exp(-i\varphi) \quad [A.1]$$

where the coefficient, $S_0$, describes the MR signal that would exist in the absence of diffusion sensitizing gradients, and $P(\phi, t)$ is the phase distribution function. According to the Gaussian phase distribution approach (C. H. Neuman, J. Chem. Phys., vol. 60, pp. 4508–4511, 1973), the function $P(\phi, t)$ is Gaussian, and the MR signal is:

$$s(t) = \exp(-\Gamma(t)), \quad \Gamma(t) = \frac{1}{2}\langle\varphi^2(t)\rangle. \quad [A.2]$$

In the presence of an inhomogeneous magnetic field, $B=B(r,t)=G(t)\cdot r$ (G is the field gradient), the Larmor frequency $\omega=\gamma B$ ($\gamma$ is the gyromagnetic ratio) also varies with spatial location of the spin; therefore the phase $\phi_i(t)$ accumulated by a spin takes the form $$\varphi_i(t) = \int_0^t dt_1 \omega(r_k(t_1), t_1).$$

This phase depends not only on the time t and the initial position of the spin, $r_k^{(0)}$, but on all the points along the trajectory $r_k(t)$ as well. Therefore, making use of the Markovian character of diffusion processes, the quantity $\langle\phi^2\rangle$ can be written in the form $$\langle\varphi^2(t)\rangle = \frac{2\gamma^2}{V} \int_0^t dt_1 \int_0^{t_1} dt_2 \int_V dr_1 \int_V dr_2 (G(t_1)r_1)(G(t_2)r_2) P(r_1, r_2, t_1 - t_2), \quad [A.3]$$

where the propagator function $P(r_1, r_2, t)$ describes the probability of a particle initially at $r_1$ moving to the point $r_2$ during the time interval t. The integration in Eq. [A.3] is over the system volume, V. When the field gradient is perpendicular to the airway principal axis, the propagator is a solution of the two-dimensional diffusion equation within a circle of radius R:

$$P(r_1, r_2, t) = \quad [A.4]$$

$$\frac{1}{S}\left\{1 + 2\sum_{n=1}^{\infty}\sum_{j} \frac{\beta_{nj}^2 \cos n(\psi_1 - \psi_2)}{(\beta_{nj}^2 - 1)J_n^2(\beta_{nj})} J_n\left(\frac{\beta_{nj}r_1}{R}\right) J_n\left(\frac{\beta_{nj}r_2}{R}\right)\right.$$

-continued $$\exp\left[-\frac{D\beta_{nj}^2 t}{R^2}\right]\bigg\}.$$

Here $r=r(\cos\psi, \sin\psi)$ is a two-dimensional vector, $S=4\pi R^2$, $J_n$ are the Bessel functions, and $\beta_{nj}$ is the jth (nonzero) root of the equation $J'_n(x)=0$ (prime denotes derivative with respect to the argument).

Substituting Eq.[A.4] into Eq. [A.3], after tedious but straightforward calculation, we obtain the transverse attenuation exponent, $\Gamma_T$, $$\Gamma_T = (\gamma G_m R)^2 \sum_j \frac{\beta_{1j}^{-2}}{(\beta_{1j}^2 - 1)} Q\left(\frac{D}{R^2}\beta_{1j}^2, \Delta, \delta, \tau\right) \quad [A.5]$$

The function $Q(a, \Delta, \delta, \tau)$ is given by $$Q(a, \Delta, \delta, \tau) = \quad [A.6]$$
$$\frac{4}{a}\left(\delta - \frac{4}{3}\tau\right) - \frac{8}{a^4\tau^2}[\exp(-a\tau) + a\tau - 1] + \frac{16}{a^4\tau^2}\sinh^2\left(\frac{a\tau}{2}\right)$$
$$\left[\exp(-a(\delta - \tau)) - 2\sinh^2\left(\frac{a(\delta - \tau)}{2}\right)\exp(-a\Delta)\right]$$

where $a=D_0\beta_{1j}^2/R^2$. If the field gradient waveform has no ramp ($\tau=0$), Eq. [A.5] reduces to the well known result. However, we should underline that in real experiments the ramp time $\tau$ is of the same order as the gradient pulse duration $\delta$, and therefore it cannot be neglected.

What is claimed is:

1. A method of acquiring MR images of a subject, wherein each voxel of interest in the subject being imaged contains a plurality of anisotropic structural units that are too small to be resolved by direct imaging of the voxels using an MRI system, said method comprising the steps of:
   a. generating MR pulse sequences via the MRI system that generate MR data corresponding to the subject's plurality of anisotropic structural units, wherein the sequences include MR imaging or spectroscopy pulse sequences with a series of embedded diffusion-sensitizing gradient waveforms of varying gradient strength that are each characterized by a respective b-value within the individual sequences;
   b. acquiring the MR data for each b-value;
   c. defining a nonlinear function of the b-value;
   d. defining imaging units;
   e. fitting the acquired MR data for each of the imaging units containing a plurality of anisotropic structural units to the nonlinear function and thereby determining elements of an apparent diffusion coefficient with respect to each of said plurality of anisotropic structural units in at least one selected direction in the local coordinate system associated with a given one of said anisotropic structural units; and
   f. creating MR images based on the elements of the apparent diffusion coefficient in the at least one selected direction in the local coordinate system associated with a given one of said anisotropic structural units contained within the subject being imaged.

2. The method of claim 1 further comprising the step of conducting a diagnostic evaluation of geometrical parameters of the subject's plurality of anisotropic structural units based on the acquired MR data.

3. The method of claim 1 wherein the MR pulse sequences include at least one of a spin echo pulse sequence, a gradient echo pulse sequence, and a spectroscopy pulse sequence, applied to the subject being imaged as at least one of a two-dimensional multi-slice multi-gradient pulse sequence, a three-dimensional multi-gradient pulse sequence, and a spectroscopy pulse sequence.

4. The method of claim 1 wherein each b-value is determined by a time-dependent field gradient waveform $G(t)$ such that, $$b = \gamma^2 \int_0^t dt_1 \left[\int_0^{t_1} dt_2 G(t_2)\right]^2,$$

where $\gamma$ is the gyromagnetic ratio and t is time.

5. The method of claim 1 wherein each of the diffusion-sensitizing gradient waveforms of varying gradient strength comprises a trapezoidal gradient waveform and wherein a general expression for each b-value is $$b = (\gamma G_m)^2\left[\delta^2\left(\Delta - \frac{\delta}{3}\right) + \tau\left(\delta^2 - 2\Delta\delta + \Delta\tau - \frac{7}{6}\delta\tau + \frac{8}{15}\tau^2\right)\right],$$

where $G_m$ is the amplitude of the gradient, $\Delta$ is a diffusion time, $\delta$ is a pulse width, and $\tau$ is a gradient ramp up and ramp down time.

6. The method of claim 1 wherein the nonlinear function of the b-value, designated $F(b)$, defines MR signal attenuation in the presence of said diffusion-sensitizing gradients such that $$F(b) = \int_\lambda d\lambda p(\lambda) \int_0^\pi \sin\theta d\theta \int_0^{2\pi} d\varphi P_\lambda(\theta, \varphi) \exp\{-b[D_z(\lambda, b)\cos^2\theta + \sin^2\theta(D_x(\lambda, b)\cos^2\varphi + D_y(\lambda, b)\sin^2\varphi)]\}$$

where $P_\lambda(\theta, \phi)$ is a distribution function of the orientation of a given subset of the subject's plurality of anisotropic structural units within each of said imaging units, characterized by the same parameter $\lambda$; where $p(\lambda)$ is a distribution function of the geometrical parameters of the subject's plurality of anisotropic structural units within each of said imaging units; and where $D_x$, $D_y$, $D_z$ are the diagonal elements of the tensor of the apparent diffusion coefficients, characteristic to a given structural unit of the subject's plurality of anisotropic structural units, in the local coordinate system associated with a given one of said structural units.

7. The method of claim 1 wherein the nonlinear function of the b-value, designated $F(b)$, for a material having homogeneous orientation distribution of the subject's plurality of anisotropic structural units is reduced to $$F(b) = \int_\lambda d\lambda p(\lambda) \exp(-bD_{AV}) \exp\left(\frac{bD_{AN}}{3}\right) \cdot \frac{1}{4\sqrt{\pi}}$$

-continued $$\int_0^{2\pi} d\varphi \exp(-bD_{AN}\cos^2\varphi) \frac{\Phi[(bD_{AN} - bd_{AN}\cos 2\varphi)^{1/2}]}{(bD_{AN} - bd_{AN}\cos 2\varphi)^{1/2}}$$

where $\Phi$ is the error function, $D_{AV}=\frac{1}{3}(D_x+D_y+D_z)$ is the anisotropic structural unit mean diffusivity, $d_{AN}=\frac{1}{2}(D_x+D_y)$ is the anisotropic structural unit in-plane anisotropy difflisivity, and $D_{AN}=D_z-\frac{1}{2}(D_x+D_y)$ is the anisotropic structural unit out-of-plane anisotropy diffusivity.

8. The method of claim 1 further comprising reducing the nonlinear function of the b-value, designated F(b), for materials including similar anisotropic structural units of uniaxial anisotropy ($D_x=D_y$) to:

$$F(b) = \exp(-bD_{AV})\frac{\sqrt{\pi}}{2}\exp\left(\frac{bD_{AN}}{3}\right) \cdot \frac{\Phi(\sqrt{dD_{AN}})}{\sqrt{bD_{AN}}}$$

where $\Phi$ is the error function, $D_{AV}=\frac{1}{3}(D_x+D_y+D_z)$ is the anisotropic structural unit mean diffusivity, and $D_{AN}=D_z-\frac{1}{2}(D_x+D_y)$ is the anisotropic structural unit out-of-plane anisotropy diffusivity.

9. The method of claim 1 wherein the step of creating MR images based on the elements of the apparent diffusion coefficient comprises the steps of creating an MR image corresponding to an anisotropic structural unit mean diffusivity $D_{AV}(x, y, z)$ based on the fitted acquired MR data, creating an image corresponding to an out-of-plane anisotropy diffusivity $D_{AN}(x, y, z)$ based on the fitted acquired MR data, and creating an image corresponding to an in-plane anisotropy diffusivity $d_{AN}(x, y, z)$ based on the fitted acquired MR data.

10. The method of claim 1 wherein each voxel of interest in the subject contains anisotropic structural units comprising a gas in small airways such as the small airways in the lungs of humans and animals that are too small to be resolved by direct MR imaging of the voxels using the MRI system.

11. A method as in claim 1 including further processing the MR data and thereby deriving estimates of dimensions of each of said anisotropic structural units in at least one selected direction.

12. A method as in claim 11 in which the at least one selected direction includes a direction perpendicular to the length of elongated structural units.

13. A method as in claim 11 in which the at least one selected direction includes a direction parallel to the length of elongated structural units.

14. An MRI apparatus acquiring MR images of a material, wherein each voxel of interest within the material contains a plurality of anisotropic structural units that are too small to be resolved by direct imaging of the material's voxels using the MRI apparatus, comprising:

a. a magnetic resonance imaging system having a magnetic assembly including a magnet impressing a polarizing magnetic field on the material, a plurality of gradient coils positioned about the material impressing an inhomogeneous magnetic field on the material, a RF transceiver system having an RF coil assembly, and an RF switch controlling the RF transceiver system in order to transmit and receive RF signals to and from the material and acquire MR data from the material;

b. said gradient coils and RF transceiver system selectively applying to the subject MR pulse sequences including MR imaging pulse sequences or spectroscopy pulse sequences with a series of embedded diffusion-sensitizing gradient waveforms of varying gradient strength that are each characterized by a respective b-value within the individual sequences;

c. said RF transceiver system acquiring MR data corresponding to each b-value;

d. a processor containing information defining imaging units and defining a non-linear function of the b-values;

e. said processor being coupled with the RF transceiver system and receiving the MR data acquired thereby and fitting the acquired MR data corresponding to each of the imaging units for the material's plurality of anisotropic structural units to the nonlinear function and thereby determining elements of an apparent diffusion coefficient with respect to each of said structural units in at least one selected direction related to an orientation of each of said anisotropic structural units; and f. said processor further creating MR images of the material based on the elements of the apparent diffusion coefficient in the at least one selected direction related to an orientation of each of said anisotropic structural units contained within the material; and g. a display coupled to the processor and selectively receiving the created MR images and selectively displaying the received MR images of the apparent diffusion coefficient in the at least one selected direction related to an orientation of each of said anisotropic structural units contained within the material.

15. The apparatus of claim 14 further comprising:

a digitizer coupled with the RF transceiver system and digitizing the RF signals received by the RF coil assembly; and a memory module coupled with the digitizer and storing the digitized MR signals in an array of raw k-space data; and said processor rearranging the raw k-space data into separate k-space data arrays for each of the MR images, processing each of the separate k-space data arrays and thereby creating said MR images.

16. The apparatus of claim 14 wherein each voxel of interest within the material comprises a gas in small airways such as the small airways within the lungs of humans and animals that are too small to be resolved by direct imaging of the voxels by the MRI apparatus.

17. A system acquiring MR images of a subject, wherein each voxel of interest in the subject contains a plurality of anisotropic structural units that are too small to be resolved by direct imaging of the voxels with the system, comprising:

a. an MR pulse sequence generator generating a series of MR pulse sequences including MR imaging pulse sequences or spectroscopy pulse sequences, said pulse sequences including embedded diffusion-sensitizing gradients of varying gradient strength, said diffusion-sensitizing gradient being characterized by a parameter that is different for different ones of said MR pulse sequences;

b. an MR data acquisition system acquiring MR data from the subject generated in response to said MR pulse sequences, said MR data acquisition system including a memory storing the acquired MR data;

c. a processor containing information defining imaging units and defining a non-linear function of the parameter characterizing the diffusion-sensitizing gradients;

d. said processor being coupled with the MR data acquisition system and receiving the MR data acquired thereby and fitting the acquired MR data that corresponds to each of the imaging units to the nonlinear function and thereby determining elements of an apparent diffusion coefficient with respect to each of the anisotropic structural units in at least one selected direction related to an orientation of each of said anisotropic structural units; and e. said processor reconstructing MR images of the subject based on the elements of the apparent diffusion coefficient in the at least one selected direction related to an orientation of each of said anisotropic structural units contained within the subject; and f. a display coupled to the processor and selectively receiving the created MR images and selectively displaying the received MR images of the apparent diffusion coefficient in the at least one selected direction related to an orientation of each of said anisotropic structural units contained within the subject.

18. The system of claim 17 wherein the MR pulse sequences include at least one of a two-dimensional multi-slice multi-gradient pulse sequence, a three-dimensional multi-gradient pulse sequence, and a spectroscopy pulse sequence.

19. The system of claim 17 wherein the parameter of the diffusion-sensitizing gradients is a b-value, the non-linear function is a nonlinear function of a b-value, and the b-value is determined by a field gradient waveform G(t) such that, $$b = \gamma^2 \int_0^t dt_1 \left[ \int_0^{t_i} dt_2 G(t_2) \right]^2,$$

where $\gamma$ is the gyromagnetic ratio and t is time.

20. The system of claim 17 wherein the diffusion-sensitizing gradients comprise a trapezoidal gradient waveform and wherein a general expression for the b-value is $$b = (\gamma G_m)^2 \left[ \delta^2 \left( \Delta - \frac{\delta}{3} \right) + \tau \left( \delta^2 - 2\Delta\delta + \Delta\tau - \frac{7}{6}\delta\tau + \frac{8}{15}\tau^2 \right) \right],$$

where $G_m$ is the amplitude of the gradient, $\Delta$ is a diffusion time, $\delta$ is a pulse width, and $\tau$ is a gradient ramp up and ramp down time.

21. The system of claim 17 wherein the nonlinear function is designated F(b) and defines MR signal attenuation in the presence of said diffusion-sensitizing gradients such that $$F(b) = \int_\lambda d\lambda p(\lambda) \int_0^\pi \sin\theta d\theta \int_0^{2\pi} d\varphi P_\lambda(\theta, \varphi)$$
$$\exp\{-b[D_z(\lambda, b)\cos^2\theta + \sin^2\theta(D_x(\lambda, b)\cos^2\varphi + D_y(\lambda, b)\sin^2\varphi)]\}$$

where $P_\lambda(\theta, \phi)$ is a distribution function of the orientation of a given subset of the subject's plurality of anisotropic structural units within each of said imaging units, characterized by the same parameter $\lambda$; where $p(\lambda)$ is a distribution function of the geometrical parameters of the subject's plurality of anisotropic structural units within each of said imaging units; and where $D_x$, $D_y$, $D_x$ are the diagonal elements of the tensor of the apparent diffusion coefficients in the local coordinate system associated with a given one of said anisotropic structural units in the subject.

22. The system of claim 17 wherein the nonlinear function is designated F(b) for a subject having homogeneous orientation distribution of the subject's structural units is reduced to $$F(b) = \int_\lambda d\lambda p(\lambda) \exp(-bD_{AV}) \exp\left(\frac{bD_{AN}}{3}\right) \cdot \cdot \frac{1}{4\sqrt{\pi}}$$
$$\int_0^{2\pi} d\varphi \exp(-bD_{AN}\cos^2\varphi) \frac{\Phi[(bD_{AN} - bd_{AN}\cos 2\varphi)^{1/2}]}{(bD_{AN} - bd_{AN}\cos 2\varphi)^{1/2}}$$

where $\Phi$ is the error function, $D_{AV} = \frac{1}{3}(D_x = D_y + D_z)$ is the anisotropic structural unit mean diffusivity, $d_{AN} = \frac{1}{2}(D_x - D_y)$ is the anisoptropic structural unit in-plane anisotropy diffusivity, and $D_{AN} = D_z - \frac{1}{2}(D_x + D_y)$ is the anisotropic structural unit out-of-plane anisotropy diffusivity.

23. The system of claim 17 wherein the nonlinear function is designated F(b) for a subject including similar structural units of uniaxial anisotropy ($D_x=D_y$) and is reduced to:

$$F(b) = \exp(-bD_{AV}) \frac{\sqrt{\pi}}{2} \exp\left(\frac{bD_{AN}}{3}\right) \cdot \frac{\Phi(\sqrt{bD_{AN}})}{bD_{AN}}$$

where $\Phi$ is the error function, $D_{AV}=\frac{1}{3}(D_x+D_y+D_z)$ is the anisotropic structural unit mean diffusivity, and $D_{AN}=D_z-\frac{1}{2}(D_x+D_y)$ is the anisotropic structural unit out-of-plane anisotropy diffusivity.

24. The system of claim 17 wherein said processor reconstructing MR images of the subject based on the elements of the apparent diffusion coefficient reconstructs an image corresponding to an anisotropic structural unit mean diffusivity $D_{AV}$(x, y, z) based on the fitted MR data, an image corresponding to an out-of-plane anisotropy diffusivity $D_{AN}$(x, y, z) based on the fitted MR data, and an image corresponding to an in-plane anisotropy diffusivity $d_{AN}$(x, y, z) based on the fitted MR data.

25. The system of claim 17 wherein each voxel of interest in the subject contains structural units comprising a gas in small airways such as the small airways in the lungs of humans and animals that are too small to be resolved by direct imaging of the voxels with the system.

26. An MRI method for acquiring MR images of a material, wherein each voxel of interest in the material contains a plurality of anisotropic structural units that are too small to be resolved by direct imaging of the voxels using a magnetic resonance imaging system having a magnetic assembly including a magnet to impress a polarizing magnetic field on the material, a plurality of gradient coils positioned about the subject to impress an inhomogeneous magnetic field on the material, a RF transceiver system having an RF coil assembly, and an RF switch responsive to a pulse module controlling the RF transceiver system to transmit and receive RF signals to and from the material to acquire MR data containing information for MR images of the material, the MRI method comprising the steps of:
- a. acquiring multiple sets of MR data from the RF transceiver system in response to MR pulse sequences that include difftision-sensitizing gradients, wherein the diffusion-sensitizing gradient differ from one of said MR pulse sequences to another;
- b. determining a signal intensity for each set of the acquired MR data;
- c. fitting the determined signal intensity for each set of MR data to a nonlinear function of a parameter related to said diffusion-sensitizing gradients;
- d. determining elements of an apparent diffusion coefficient with respect to each of said anisotropic structural units contained in said material for the fitted MR data in at least one selected direction related to an orientation of each of said anisotropic structural units contained in said material;
- e. reconstructing MR images of the material based on the determined elements of the apparent diffusion coefficient for the fitted MR data in the at least one selected direction related to an orientation of each of said anisotropic structural units contained in said material; and
- f. selectively displaying the reconstructed MR images of the material.

27. The method of claim 26 further comprising the steps of:
- a. digitizing the determined signal intensity for each set of the acquired MR data;
- b. storing the digitized signal intensity for each set of the acquired MR data in a memory as an array of raw k space data;
- c. rearranging the raw k-space data into separate k-space data arrays for each MR image of the subject to be reconstructed; and
- d. processing each separate k-space data array to reconstruct the MR images of the subject.

28. The method of one of claim 26 or 27 wherein each voxel of interest in the material comprises a gas in small airways such as the small airways in the lungs of humans and animals that are too small to be resolved by direct imaging of the voxels with said system.

29. A method as in claim 26 including further processing the MR data and thereby estimating radial dimensions of said structural units.

30. A method comprising:
- a. acquiring MR data of a subject, wherein each voxel of interest in the subject contains anisotropic structural units that are too small to be imaged directly with MRI of the voxels, using a number of MR pulse sequences, wherein:
  - i. at least some of said MR pulse sequences include diffusion-sensitizing gradients; and
  - ii. said included diffusion-sensitizing gradients are different for each of the corresponding gradients applied in each of the number of said pulse sequences;
- b. defining an array of image pixels;
- c. estimating several pixel values for each of the defined image pixels by fitting the acquired MR data to a non-linear function relating a parameter of said diffusion-sensitizing gradients to the acquired MR data, wherein each of the several pixel values for a given one of said image pixels is estimated by fitting MR data for a respective one of said MR pulse sequences to said non-linear function;
- d. deriving estimates of parameters related to the diffusion of fluids in the subject in at least one selected direction related to the orientation of each of said anisotropic structural units contained in said subject that are too small to be imaged directly with MRI of the voxels, using the pixel image data; and
- e. selectively storing or displaying images of selected distributions in the subject of said parameters related to said diffusion of fluids in the subject in said at least one selected direction.

31. A system comprising:
- a. an MRI magnet and data acquisition unit providing MR data of a subject, wherein each voxel of interest in the subject contains a plurality of anisotropic structural units that are too small to be imaged directly with MRI of the voxels with said system, said data acquisition unit providing said MR data of the subject by applying to the subject a number of MR pulse sequences, wherein:
  - i. at least some of the number of said MR pulse sequences include diffusion-sensitizing gradients; and
  - ii. said included diffusion-sensitizing gradients are different for each of the corresponding grandients applied in each of the number of said pulse sequences;
- b. an MRI image processor containing information defining an array of image pixels and converting the acquired MRI data to pixel image data corresponding to each of the image pixels and thereby estimating several pixel values corresponding to each of the image pixels, each of the pixel values corresponding to any one of said image pixels pertaining to a respective one of the pulse sequences;
- c. a diffusion calculator that processes the several pixel values corresponding to each of the image pixels according to a non-linear relationship of the pixel values and parameters related to diffusion of fluids in the subject at each of said anisotropic structural units in at least one selected direction and thereby deriving estimates of directional diffusion of the fluids in the subject at respective locations in the subject;
- d. a diffusion image processor processing said estimates of directional diffusion into at least one image of the values, at selected locations in the subject, of the diffusion in at least one selected direction relative to an orientation of each of said anisotropic structural elements; and
- e. selectively storing and/or displaying said at least one image of the diffusion at each of said anisotropic structural units.

* * * * *